(12) United States Patent
Chang et al.

(10) Patent No.: US 8,900,531 B2
(45) Date of Patent: Dec. 2, 2014

(54) METHOD FOR BONDING PLASTIC MICRO CHIP

(75) Inventors: Jun Keun Chang, Seoul (KR); Dae Sung Hur, Kyungsan-Si (KR); Chanil Chung, Uniwang-Si (KR); Jun Ha Park, Suwon-Si (KR); Han Sang Jo, Anyang-Si (KR)

(73) Assignee: Nanoentek Inc., Seoul (KR)

( * ) Notice: Subject to any disclaimer, the term of this patent is extended or adjusted under 35 U.S.C. 154(b) by 0 days.

(21) Appl. No.: 12/916,098

(22) Filed: Oct. 29, 2010

(65) Prior Publication Data

US 2011/0044862 A1 Feb. 24, 2011

Related U.S. Application Data

(62) Division of application No. 10/583,149, filed as application No. PCT/KR2004/003337 on Dec. 17, 2004, now Pat. No. 7,842,157.

(30) Foreign Application Priority Data

Dec. 18, 2003 (KR) .......................... 10-2003-0093443

(51) Int. Cl.
  *B01L 99/00* (2010.01)
  *H01L 25/04* (2014.01)
  (Continued)

(52) U.S. Cl.
  CPC ............. *H01L 25/046* (2013.01); *B01L 3/5027* (2013.01); *B01L 3/502707* (2013.01); *B01L 2200/12* (2013.01); *B01L 2300/0816* (2013.01); *B01L 2300/0825* (2013.01); *B01L 2300/0887* (2013.01); *B29C 59/14* (2013.01); *B29C 65/02* (2013.01); *B29C 65/08* (2013.01); *B29C 65/14* (2013.01); *B29C 65/16* (2013.01); *B29C 65/48* (2013.01); *B29C 65/4895* (2013.01); *B29C 65/54* (2013.01); *B29C 65/548* (2013.01); *B29C 66/02* (2013.01); *B29C 66/3022* (2013.01); *B29C 66/54* (2013.01); *B29K 2023/06* (2013.01); *B29K 2023/12* (2013.01); *B29K 2025/00* (2013.01); *B29K 2033/12* (2013.01); *B29K 2069/00* (2013.01); *B29K 2995/0026* (2013.01); *B29L 2031/756* (2013.01); *B29C 66/8322* (2013.01); *B29C 66/542* (2013.01); *B29C 66/53461* (2013.01)
  USPC .......................................... 422/507; 422/502

(58) Field of Classification Search
  CPC ..................... B01L 3/502707; B01L 3/5027
  USPC .......................................... 422/502–504, 507
  See application file for complete search history.

(56) References Cited

U.S. PATENT DOCUMENTS 4,171,866 A 10/1979 Tolles
4,181,549 A 1/1980 McPhee
(Continued)

FOREIGN PATENT DOCUMENTS

DE 44 14 915 A1 11/1995
DE 196 32 275 A1 2/1998
(Continued)

OTHER PUBLICATIONS

Translation of DE 19632275 A1.*

(Continued)

*Primary Examiner* — Paul Hyun

(57) ABSTRACT

Disclosed is a method of bonding upper and lower substrates for manufacturing a plastic micro chip comprising the upper substrate, the lower substrate and a sample filling space having a predetermined height for filling a sample between the upper and lower substrates. According to the method, the upper and lower substrates are bonded by introducing an organic solvent between the upper and lower substrates. In addition, the invention provides a method of manufacturing a micro chip using the method and a micro chip manufactured according to the method. According to the invention, it is possible to easily and precisely bond the upper and lower substrates of the plastic micro chip.

11 Claims, 5 Drawing Sheets

(51) Int. Cl.
*B29C 65/08* (2006.01)
*B29C 65/54* (2006.01)
*B29C 65/00* (2006.01)
*B01L 3/00* (2006.01)
*B29C 59/14* (2006.01)
*B29C 65/02* (2006.01)
*B29C 65/14* (2006.01)
*B29C 65/16* (2006.01)
*B29C 65/48* (2006.01)
*B29K 23/00* (2006.01)
*B29K 25/00* (2006.01)
*B29K 33/00* (2006.01)
*B29K 69/00* (2006.01)
*B29L 31/00* (2006.01)

(56) References Cited

U.S. PATENT DOCUMENTS

| | | | |
|---|---|---|---|
| 4,357,369 A | | 11/1982 | Kilichowski et al. |
| 4,485,171 A | * | 11/1984 | Ikeda et al. ............ 435/30 |
| 4,651,382 A | | 3/1987 | Krolick |
| 5,259,835 A | * | 11/1993 | Clark et al. ............ 602/48 |
| 5,259,874 A | | 11/1993 | Miller et al. |
| 5,349,436 A | | 9/1994 | Fisch |
| 5,670,109 A | | 9/1997 | DeRees |
| 5,882,465 A | | 3/1999 | McReynolds |
| 6,052,224 A | | 4/2000 | Richardson |
| 6,123,798 A | | 9/2000 | Gandhi et al. |
| 6,251,343 B1 | | 6/2001 | Dubrow et al. |
| 6,284,113 B1 | | 9/2001 | Bjornson et al. |
| 6,329,224 B1 | | 12/2001 | Nguyen et al. |
| 6,375,871 B1 | | 4/2002 | Bentsen et al. |
| 6,425,972 B1 | | 7/2002 | McReynolds |
| 6,559,940 B2 | | 5/2003 | Fujiyama |
| 6,561,208 B1 | | 5/2003 | O'Connor et al. |
| 6,756,019 B1 | | 6/2004 | Dubrow et al. |
| 7,226,564 B2 | | 6/2007 | Ono |
| 7,514,045 B2 | | 4/2009 | Corcoran et al. |
| 7,842,157 B2 | | 11/2010 | Chang et al. |
| 2002/0117517 A1 | | 8/2002 | Unger et al. |
| 2002/0151078 A1 | * | 10/2002 | Kellogg et al. ............ 436/45 |
| 2002/0177319 A1 | | 11/2002 | Chou |
| 2003/0145942 A1 | * | 8/2003 | Andrews et al. ............ 156/285 |
| 2003/0180190 A1 | | 9/2003 | Corcoran et al. |
| 2004/0121450 A1 | * | 6/2004 | Pugia et al. ............ 435/287.1 |
| 2004/0241381 A1 | * | 12/2004 | Chen ............ 428/66.6 |

FOREIGN PATENT DOCUMENTS

| | | |
|---|---|---|
| DE | 19632275 A1 * | 12/1998 |
| DE | 19922075 A1 | 11/2000 |
| EP | 0107631 | 5/1984 |
| EP | 0 711 650 A1 | 5/1996 |
| EP | 1296133 | 3/2003 |
| JP | 58002709 U | 1/1983 |
| JP | 05042203 A | 2/1993 |
| WO | WO-98/45693 | 10/1998 |
| WO | WO 99/25783 A1 | 5/1999 |
| WO | WO-00/78455 | 12/2000 |
| WO | WO-01/03876 | 1/2001 |
| WO | WO-01/26812 | 4/2001 |
| WO | WO-01/77641 | 10/2001 |
| WO | 02/36042 | 5/2002 |

OTHER PUBLICATIONS

Gerlach et al., "Propagation of Adhesives in Joints During Capillary Adhesive Bonding of Microcomponents," Microsystem Technologies 6, Apr. 12, 1999, pp. 19-22.

Edwards et al., "Rapid Tooling Using SU-8 for Injection Molding Microfluidic Components," <www: http://users.ece.gatech.edu/frazier/mil.html>.

"Plasmc surface modification", http://www.immunosurface.com/eng/surface/index.html, Dec. 7, 2002, Technical Note N.2.

O.S. Kolluri et al., "$4^{th}$ State, Plasma Assisted Coatings for the Plastics Industry", Fourth International Conference on Surface Modification Technologies, http://www.4thstate.com/publications/AssistedCoatingsPrint.htm, Nov. 1990, Paris, France.

J.F. Friedrich et al., "Barrier properties of plasma and chemically fluorinated polypropylene and polyethyleneterephthalate", Surface and Coatings Technology, 1995, pp. 910-918, 74-75, Elsevier.

Stephen L. Kaplan, "$4^{th}$ State, Plasma, The Chemistry Tool for the $21^{st}$ Century", http://www.4thstate.com/publications/21stCentury.htm, Dec. 7, 2002.

* cited by examiner

METHOD FOR BONDING PLASTIC MICRO CHIP

This is a divisional of U.S. patent application Ser. No. 10/583,149, filed on Jun. 16, 2006, which is the U.S. National Phase application of International Application No. PCT/KR2004/003337 filed on Dec. 17, 2004, which claims the benefit under §119 of Korean Application No. 10-2003-0093443 filed on Dec. 18, 2003, the contents of each of which are incorporated herein.

TECHNICAL FIELD

The invention relates to a method of bonding a plastic micro chip, and more particularly to a method of bonding upper and lower substrates for manufacturing a plastic micro chip comprising the upper substrate, the lower substrate and a sample filling space having a predetermined height for filling a sample between the upper and lower substrates, wherein the upper and lower substrates are bonded by introducing an organic solvent between the upper and lower substrates. In addition, the invention relates to a method of manufacturing a micro chip using the boning method and a micro chip manufactured according to the method.

BACKGROUND ART

Currently, researches and commercialization of a point of care (POC) and a lab-on-a-chip (LOC) (which means a laboratory on a chip and is a technology for diagnosing various diseases in a small chip at a time) are actively carried out in a bio-industry. Typically, products allowing for a rapid diagnosis and experiment as the POC or LOC are released as a product with a special surface treatment or reagent fixed in a plastic micro chip or cartridge. It can be said that the cartridge or chip is a core of the product.

Generally, the plastic micro chip or cartridge used for the POC and LOC is made of polyethylene (PE) derivatives such as polycarbonate (PC), polystyrene (PS), polypropylene (PP) and polyethyleneterephthalate (PET), polymethylmethacrylate (PMAA) or an acryl based plastic, and is used as a disposable.

FIGS. 1 and 2 show a typical plastic micro chip used for a lab-on-a-chip. Generally, the plastic micro chip comprises an upper substrate 16, a lower substrate 18 and a sample filling space (channel) 10 having a predetermined height D or a fine structure, etc. between the upper and lower substrates.

It is required that the channel should be precisely manufactured to have a height of several μm to several hundreds μm when manufacturing the plastic micro chip. Accordingly, it is required to very precisely and correctly bond the upper and lower substrates including the channel or fine structure so that the plastic micro chip can perfectly function. In addition, surface properties of main parts of the cartridge or the chip should be maintained as they are.

When manufacturing the plastic micro chip, the upper and lower substrates are generally bonded by a heat bonding, an ultrasonic bonding, an optical method or an adhesive using a primer.

The heat bonding method is mainly used to bond the material such as a film. The optical method is a boding method using a specific molecular structure of the plastic surface and can be applied to some plastics only. The method using the adhesive is used even in daily life. The ultrasonic bonding method is actively used in industries.

However, there are some disadvantages when bonding the plastic micro chip using the above methods. In other words, there is a limitation in correctly and precisely bonding the chip having the fine channel or structure without an error, and it is difficult to bond the chip without influencing on properties of an inner surface thereof.

FIGS. 3 and 4 show a bonding process according to an ultrasonic bonding method of the prior art.

As shown in FIG. 3, a protrusion is formed on a lower surface of an upper substrate 16 and a recess is formed in an upper surface of a lower substrate 18. Then, when an ultrasonic wave is applied with the upper and lower substrates 16, 18 being overlapped, the protrusion of the upper substrate 16 is melted and thus the upper substrate 16 is bonded to the lower substrate 18. However, as shown in FIG. 4, since the bonding surface is irregular and rough, an empty space can be formed and it is difficult to control the channel to have a predetermined height (D), so that an error can occur.

Generally, in a plastic micro chip, the height of the channel should be also precisely controlled in order to precisely manufacture a volume of the channel. However, it is difficult to precisely control the height of the channel with the prior bonding methods.

In addition, since the channel is not completely sealed and an empty space can be thus formed, a sample in the channel can flow out to the exterior and an air bubble can occur in the sample inside of the channel.

DISCLOSURE OF INVENTION

Accordingly, the present invention has been made to solve the above-mentioned problems occurring in the prior art. In the present invention, an organic solvent is introduced between an upper substrate and a lower substrate, and thus the substrates are easily and precisely bonded without an error when they are bonded.

The object of the invention is to provide a method of bonding the upper and lower substrates in order to manufacture a plastic micro chip used for a lap-on-a-chip (LOC), etc.

It is another object to provide a method of manufacturing a plastic micro chip using the bonding method.

It is yet another object to provide a plastic micro chip manufactured by the bonding method.

The invention relates to a method of bonding an upper substrate and a lower substrate in order to manufacture a plastic micro chip.

More specifically, the invention relates to a method of bonding an upper substrate and a lower substrate in order to manufacture a plastic micro chip comprising the upper substrate, the lower substrate and a sample filling space having a predetermined height for filling a sample between the upper and lower substrates, wherein the upper and lower substrates are bonded by introducing an organic solvent between the upper and lower substrates.

In addition, the invention provides a method of manufacturing a plastic micro chip comprising an upper substrate, a lower substrate and a sample filling space having a predetermined height for filling a sample between the upper and lower substrates, comprising steps of:

(a) forming a fine channel space for filling a bonding organic solvent in a bonding region of a circumference of the sample filling space; and (b) overlapping the upper and lower substrates each other, and then introducing the organic solvent into the fine channel to bond the upper and lower substrates.

Preferably, one or more holes for introducing the organic solvent communicating with the fine channel may be formed when the fine channel is formed in the step of (a).

After forming the fine channel, it may preferably to perform a corona or plasma treatment for the bonding area so that the organic solvent subsequently introduced smoothly flows and a bonding strength is increased. The plastic micro chip having a functional channel has a hydrophilic surface or a functional group such as amine group, carboxyl group or aldehyde capable of combining with a protein (for example, antigen, antibody or enzyme) or DNA. When the plasma treatment is performed as described above, impurities are removed from the surface of the bonding region and a surface energy is increased, so that the solvent can flow well. In addition, the bonding strength can be increased. However, this treatment does not have influence on the surface of the chip.

When forming the fine channel, the channel can become opaque if a height of the channel is excessively high. Accordingly, it is preferred to form the fine channel so that the height thereof is not too high. For example, it is preferred to form the channel to have a height of about 100 µm or less.

In addition, according to the invention, there is provided a plastic micro chip comprising an upper substrate, a lower substrate, a sample filling space having a predetermined height for filling a sample between the upper and lower substrates, and a fine channel defining a space for filling an organic solvent so as to bond the upper and lower substrates in a bonding region of a circumference of the sample filling space of the upper substrate.

Preferably, the plastic micro chip may comprise one or more holes for introducing the organic solvent communicating with the fine channel. The solvent in the fine channel can smoothly flow by pressurizing or decompressing the fine channel through the introducing hole.

According to the invention, the upper and lower substrates are made of polyethylene derivatives such as polycarbonate, polystyrene, polypropylene and polyethyleneterephthalate, polymethylmethacrylate or an acryl based plastic materials.

Any organic solvent capable of dissolving the material of the substrates may be used in the invention. For example, ketone, aromatic hydrocarbon, halogenated hydrocarbon or cyanoacrylate compound or a mixture thereof is used. Especially, acetone, chloroform, methylene chloride, ethylcyanoacrylate or carbon tetrachloride or a mixture thereof is preferably used.

BRIEF DESCRIPTION OF DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

Figure 1:
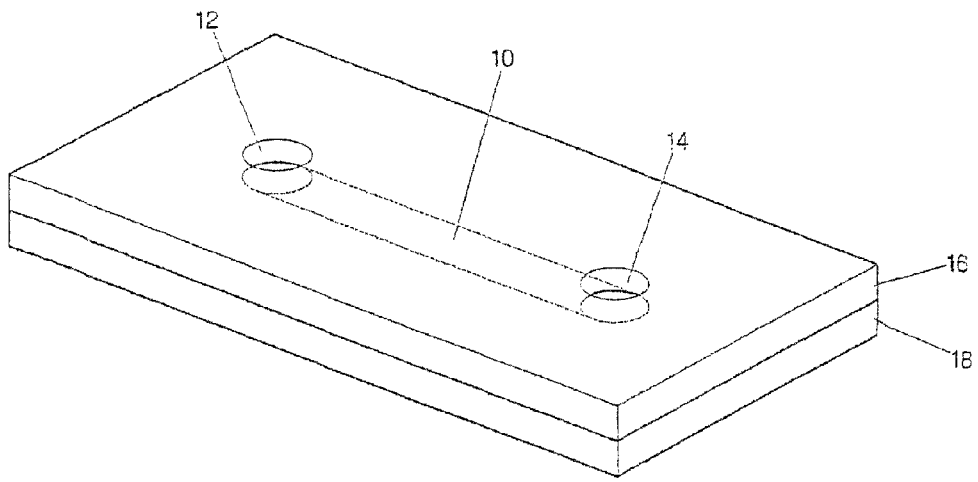
FIGS. 1 and 2 are a perspective view and a cross sectional view of a conventional plastic micro chip.
Figure 2:
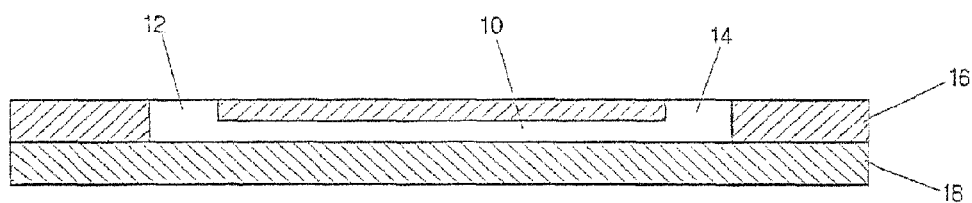
Figure 3:
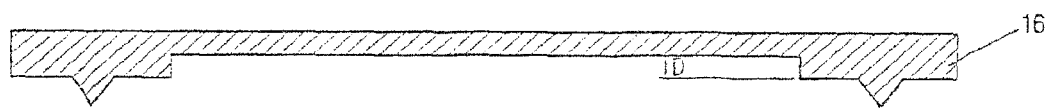
FIGS. 3 and 4 show a method of bonding an upper substrate and a lower substrate of a plastic micro chip according to the prior art.
Figure 3:
Figure 4:
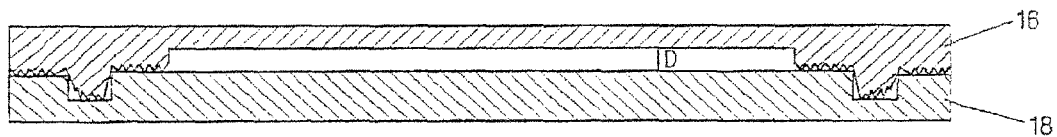

DESCRIPTION OF REFERENCE NUMERALS
FOR IMPORTANT PART OF THE DRAWINGS

| | |
|---|---|
| 100: plastic micro chip | 120: upper substrate |
| 140: lower substrate | 10: sample filling space |
| 12: sample introducing hole | 14: sample discharging hole |
| 20: bonding region | 30: fine channel |
| 35: organic solvent introducing hole | D: height of sample filling space |

Best Mode for Carrying out the Invention

Hereinafter, preferred embodiments of the present invention will be described with reference to the accompanying drawings. In the following description of the present invention, a detailed description of known functions and configurations incorporated herein will be omitted when it may make the subject matter of the present invention rather unclear.

Figure 5:
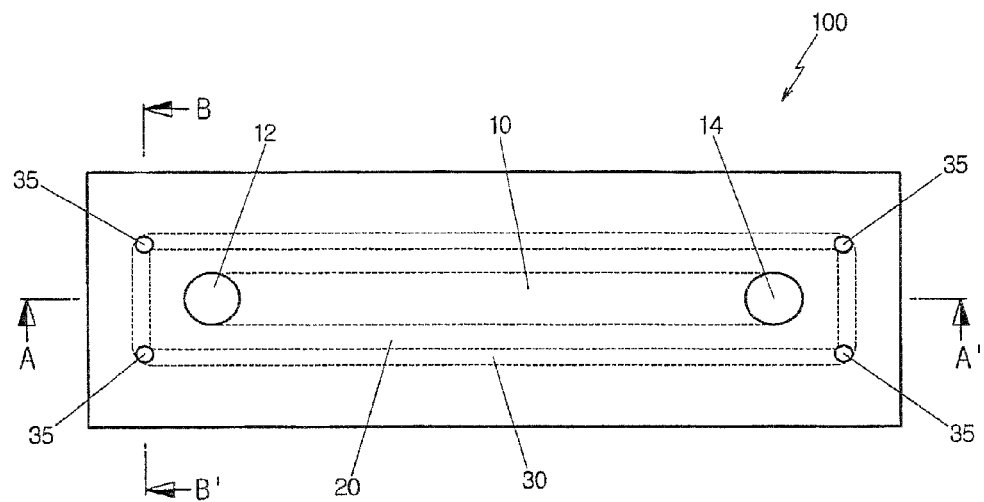
FIG. 5 is a plan view of a plastic micro chip according to a first embodiment of the invention.
Figure 6:
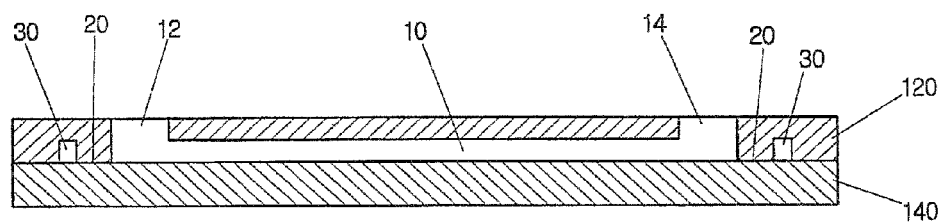
FIG. 6 is a cross sectional view of the plastic micro chip in FIG. 5 taken along line A-A'.
Figure 7:
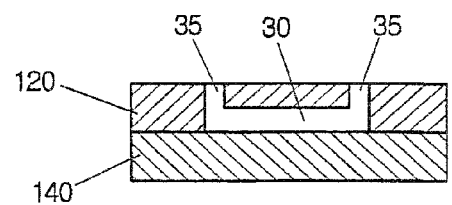
FIG. 7 is a cross sectional view of the plastic micro chip in FIG. 5 taken along line B-B'.

FIG. 5 is a plan view of a plastic micro chip 100 for bonding according to an embodiment of the invention. FIG. 6 is a cross sectional view of the plastic micro chip in FIG. 5 taken along line A-A'. FIG. 7 is a cross sectional view of the plastic micro chip in FIG. 5 taken along line B-B'.

The plastic micro chip 100 comprises an upper substrate 120, a lower substrate 140 and a sample filling space 10 having a predetermined height (D) for filling a sample between the upper substrate 120 and the lower substrate 140. A sample introducing hole 12 is formed at a side of the sample filling space 10 and a sample discharging hole 14 is formed at the other side.

A fine channel space 30 having a height of 100 µm for filling a bonding organic solvent is formed in a bonding region 20 of a circumference of the sample filling space 10. In addition, organic solvent introducing holes 35 communicating with the fine channel are formed at each of the apexes so that the organic solvent can be introduced into the fine channel 30.

Surfaces of the upper substrate 120 and the lower substrate 140 are plasma-treated so that an organic solvent (for example, acetone) subsequently introduced can flow well.

After that, in order to bond the upper substrate 120 and the lower substrate 140, the lower substrate 140 and the upper substrate 120 formed with the fine channel space 30 are overlapped each other, and the acetone is introduced into the organic solvent introducing holes 35 of the fine channel 30 in a small amount (few µl). The acetone flows along the fine channel 30 by the capillary phenomenon, and melts the upper substrate 120 and the lower substrate 140 in the bonding region 20 of the periphery of the fine channel 30, thereby bonding them.

The acetone remaining in the fine channel 30 is rapidly evaporated into the air, and the bonding region 20 is firmly bonded while sealing the sample filling space 10 without a bonding tolerance.

Figure 8:
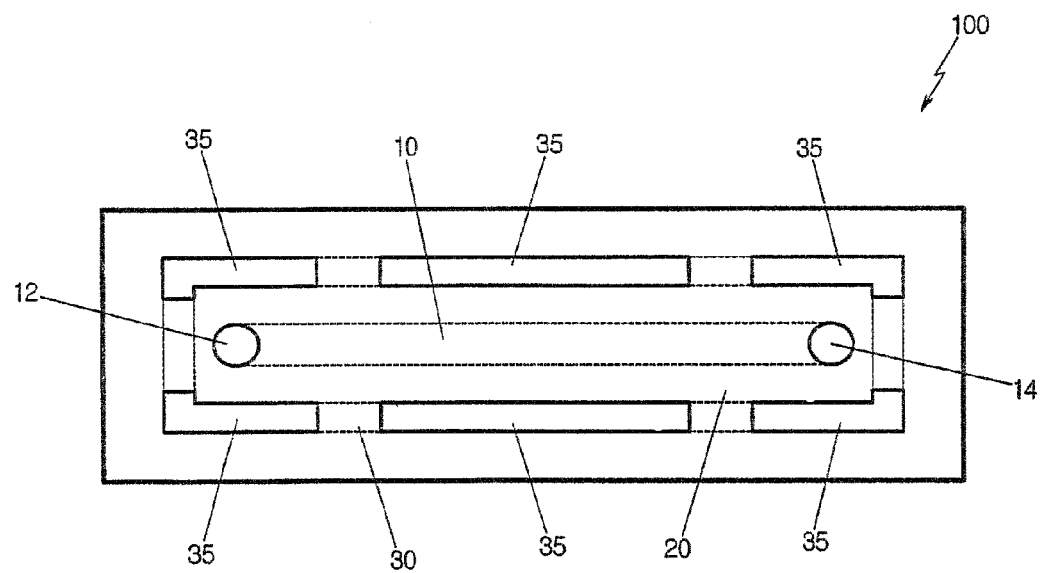
FIG. 8 is a plan view of a plastic micro chip according to a second embodiment of the invention.

FIG. 8 shows a plastic micro chip having an enlarged organic solvent introducing holes 35 for easily introducing the organic solvent into the fine channel space 30.

Figure 9:
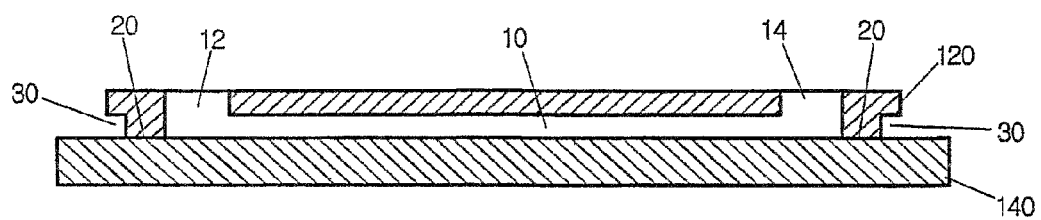
FIG. 9 is a cross sectional view of a plastic micro chip according to a third embodiment of the invention.

FIG. 9 is a cross sectional view of a plastic micro chip according to a third embodiment of the invention. The plastic micro chip according to the third embodiment of the invention includes recesses 30 formed in each of side lower ends of the upper substrate 120. The upper substrate 120 and the lower substrate 140 of the bonding region 20 can be bonded each other by introducing the organic solvent into the recesses.

INDUSTRIAL APPLICABILITY

As described above, when the plastic micro chip is manufactured according to the method of the invention, it is possible to precisely and correctly bond the upper and lower substrates of the plastic micro chip. Particularly, it is possible to perfectly seal the sample filling space (channel) of the plastic micro chip and to correctly manufacture the channel having a desired height.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A chip, comprising:
   a first substrate;
   a second substrate being provided on the first substrate;
   a sample filling space being defined by the first substrate and the second substrate, the sample filling space being configured to receive a sample for testing;
   a bonding region for bonding the first substrate and the second substrate; and
   a fine channel extending around an outermost perimeter of the first substrate, the fine channel defining a groove extending around outermost edges of the first substrate, the fine channel having a surface that is hydrophilic to facilitate flow of a solvent in the fine channel, the solvent being used to bond the first and second substrates,
   wherein the fine channel has a height that is sufficiently small to enable the solvent to flow through the fine channel by capillary action.

2. The chip according to claim 1, wherein the first substrate and the second substrate are bonded by at least one compound selected from a group consisting of ketone, aromatic hydrocarbon, cyanoacrylate compound and halogenated hydrocarbon.

3. The chip according to claim 2, wherein the first substrate and the second substrate are bonded by at least one compound selected from a group consisting of acetone, chloroform, methylene chloride, ethylcyanoacrylate and carbon tetrachloride.

4. The chip according to claim 1, wherein the height of the fine channel is 100 μm or less.

5. The chip according to claim 1, wherein the bonding region is transparent.

6. The chip according to claim 1, wherein the first and second substrates includes at least one polymer selected from a group consisting of polycarbonate, polystyrene, polypropylene, polyethylene derivatives, polymethylmethacrylate and acryl-based plastic material.

7. The chip of claim 1, wherein the chip is made of plastic.

8. The chip of claim 1, wherein the first and second substrates include plastic, and
   wherein the bonding region is defined between the outer perimeter of the first substrate and an outer perimeter of the sample filling space.

9. The chip of claim 8, wherein the fine channel defines an outer extension of the bonding region.

10. The chip of claim 9, wherein the surface of the fine channel is plasma-treated to make the surface more hydrophilic.

11. The chip of claim 1, wherein the bonding region is hydrophilic to facilitate flow of the solvent from the fine channel to be distributed sufficiently in the bonding region by capillary action for bonding the first and second substrates.

* * * * *